United States Patent
Cao et al.

(10) Patent No.: US 11,355,532 B2
(45) Date of Patent: Jun. 7, 2022

(54) RADIATION DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/128,985

(22) Filed: Dec. 21, 2020

(65) Prior Publication Data

US 2021/0151480 A1  May 20, 2021

Related U.S. Application Data

(63) Continuation of application No. PCT/CN2018/095525, filed on Jul. 12, 2018.

(51) Int. Cl.
*G01T 1/24* (2006.01)
*H01L 27/146* (2006.01)

(52) U.S. Cl.
CPC ........ *H01L 27/14601* (2013.01); *G01T 1/247* (2013.01); *H01L 27/14659* (2013.01)

(58) Field of Classification Search
CPC ......... H01L 27/14601; H01L 27/14659; G01T 1/247; G01T 1/241
See application file for complete search history.

(56) References Cited

U.S. PATENT DOCUMENTS

| | | |
|---|---|---|
| 2005/0205930 A1 | 9/2005 | Williams |
| 2007/0280409 A1 | 12/2007 | Konno |
| 2015/0069252 A1 | 3/2015 | Eichenseer |
| 2016/0099371 A1 | 4/2016 | Webster |

FOREIGN PATENT DOCUMENTS

| | | | |
|---|---|---|---|
| CN | 1841744 A | 10/2006 | |
| CN | 107533146 A | 1/2018 | |
| EP | 2677555 B1 | 5/2019 | |
| GB | 2335540 B | 1/2002 | |
| WO | WO-2006018470 A1 * | 2/2006 | ....... H01L 27/14812 |

* cited by examiner

*Primary Examiner* — Kiho Kim
(74) *Attorney, Agent, or Firm* — IPro, PLLC; Qian Gu

(57) ABSTRACT

Disclosed herein is a detector having a pixel in a substrate and configured to detect radiation particles incident thereon; a first guard ring in the substrate, surrounding the pixel, and comprising a first doped semiconductor region in the substrate and a first electrically conductive layer in electrical contact to the first doped semiconductor region; a second guard ring in the substrate, surrounding the first guard ring, and comprising a second doped semiconductor region in the substrate and a second electrically conductive layer in electrical contact to the second doped semiconductor region. The first electrically conductive layer overhangs the first doped semiconductor region toward an interior of the first guard ring by a greater extent than the second electrically conductive layer overhangs the second doped semiconductor region toward an interior of the second guard ring.

15 Claims, 14 Drawing Sheets

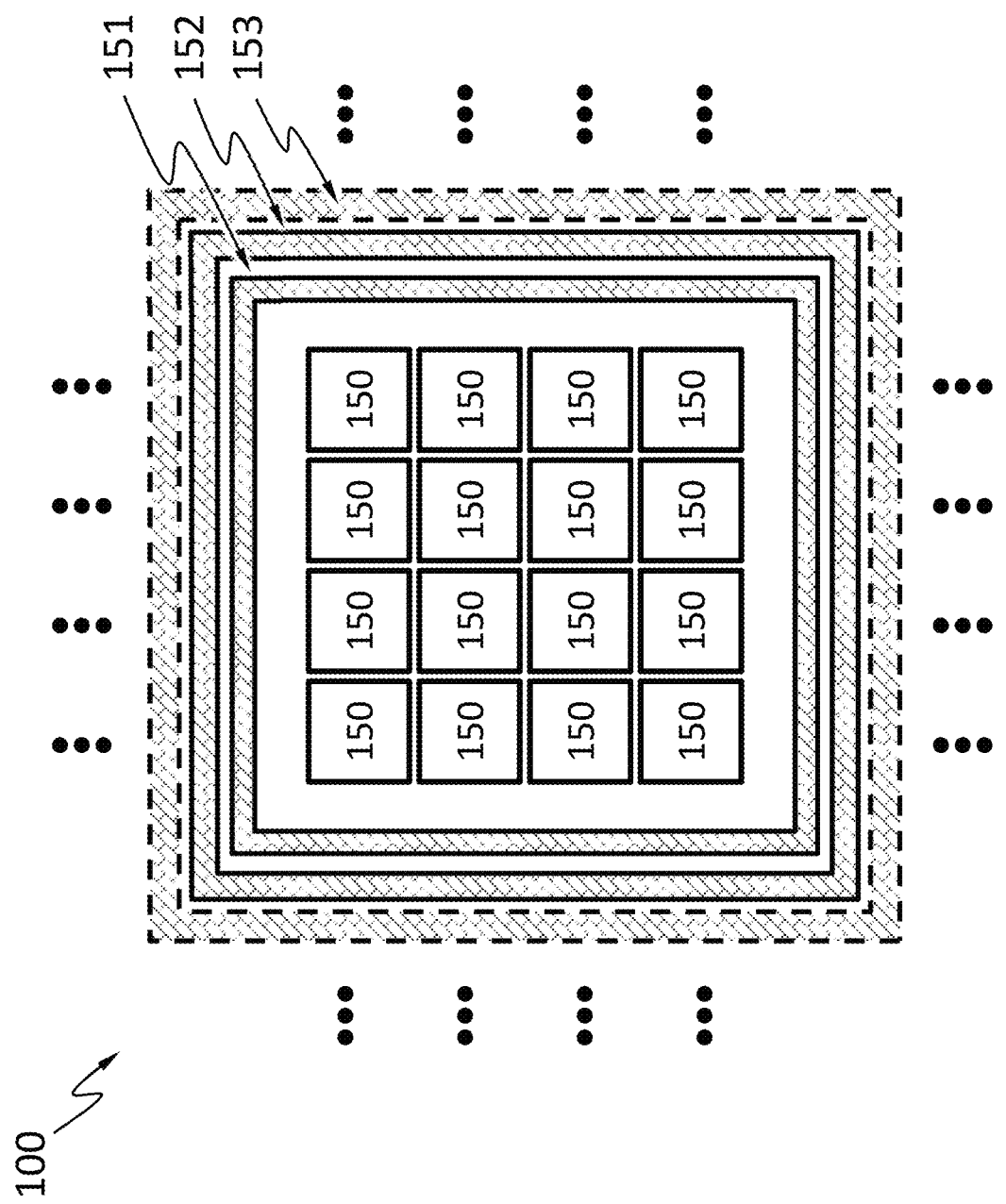

RADIATION DETECTOR

TECHNICAL FIELD

The disclosure herein relates to a radiation detector, particularly related to a detector that comprises multiple guard rings.

BACKGROUND

Radiation detectors may be devices used to measure the flux, spatial distribution, spectrum or other properties of radiations. Radiation detectors may be used for many applications. One important application is imaging. Radiation imaging is a radiography technique and can be used to reveal the internal structure of a non-uniformly composed and opaque object such as the human body.

Early radiation detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to radiation, electrons excited by radiation are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of radiation detectors are radiation image intensifiers. Components of a radiation image intensifier are usually sealed in a vacuum. In contrast to photographic plates, photographic films, and PSP plates, radiation image intensifiers may produce real-time images, i.e., do not require post-exposure processing to produce images. radiation first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident radiation. The emitted electrons are projected, through electron optics, onto an output phosphor and cause the output phosphor to produce a visible-light image.

Scintillators operate somewhat similarly to radiation image intensifiers in that scintillators (e.g., sodium iodide) absorb radiation and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of radiation. A scintillator thus has to strike a compromise between absorption efficiency and resolution.

Semiconductor radiation detectors largely overcome this problem by direct conversion of radiation into electric signals. A semiconductor radiation detector may include a semiconductor layer that absorbs radiation in wavelengths of interest. When a radiation particle is absorbed in the semiconductor layer, multiple charge carriers (e.g., electrons and holes) are generated and swept under an electric field towards electric contacts on the semiconductor layer.

SUMMARY

Disclosed herein is a detector, comprising: a pixel configured to detect radiation particles incident thereon, the pixel disposed in a substrate; a first guard ring in the substrate and surrounding the pixel, the first guard ring comprising a first doped semiconductor region in the substrate and a first electrically conductive layer in electrical contact to the first doped semiconductor region; a second guard ring in the substrate and surrounding the first guard ring, the second guard ring comprising a second doped semiconductor region in the substrate and a second electrically conductive layer in electrical contact to the second doped semiconductor region; wherein the first electrically conductive layer overhangs the first doped semiconductor region by a first extent toward an interior of the first guard ring; wherein the second electrically conductive layer overhangs the second doped semiconductor region by a second extent toward an interior of the second guard ring; wherein the second extent is greater than the first extent.

According to an embodiment, the detector comprises a plurality of pixels arranged in an array and the plurality of pixels are surrounded by the first guard ring.

According to an embodiment, the pixel comprises a doped semiconductor region in the substrate and an electric contact in electrical contact to the doped semiconductor region; wherein the electric contact overhangs the doped semiconductor region in at least two opposite directions parallel to the substrate.

According to an embodiment, the electric contact overhangs the doped semiconductor region in at least two opposite directions by a same extent.

According to an embodiment, the detector further comprises: a third guard ring in the substrate and surrounding the second guard ring, the third guard ring comprising a third doped semiconductor region in the substrate and a third electrically conductive layer in electrical contact to the third doped semiconductor region; wherein the third electrically conductive layer overhangs the third doped semiconductor region by a third extent toward an interior of the third guard ring; wherein the third extent is greater than the second extent.

According to an embodiment, the pixel is configured to count the radiation particles incident thereon.

According to an embodiment, the first electrically conductive layer has a greater width along a line parallel to the substrate and extending from the interior of the first guard ring to an exterior of the first guard ring, than the first doped semiconductor region.

According to an embodiment, the detector further comprises an electronics system; wherein the pixel comprises at least an electric contact; wherein the electronics system comprises: a first voltage comparator configured to compare a voltage of the electric contact to a first threshold; a second voltage comparator configured to compare the voltage to a second threshold; a counter configured to register a number of radiation particles reaching the pixel; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, when the second voltage comparator determines that an absolute value of the voltage equals or exceeds an absolute value of the second threshold.

According to an embodiment, the electronics system further comprises a capacitor module electrically connected to the electric contact, wherein the capacitor module is configured to collect charge carriers from the electric contact.

According to an embodiment, the controller is configured to activate the second voltage comparator at a beginning or expiration of the time delay.

According to an embodiment, the electronics system further comprises a voltmeter, wherein the controller is configured to cause the voltmeter to measure the voltage upon expiration of the time delay.

According to an embodiment, the controller is configured to determine a radiation particle energy based on a value of the voltage measured upon expiration of the time delay.

According to an embodiment, the controller is configured to connect the electric contact to an electrical ground.

According to an embodiment, a rate of change of the voltage is substantially zero at expiration of the time delay.

According to an embodiment, rate of change of the voltage is substantially non-zero at expiration of the time delay.

BRIEF DESCRIPTION OF FIGURES

FIG. 1 schematically shows an exemplary top view of a portion of a radiation detector.

DETAILED DESCRIPTION

Figure 2A:
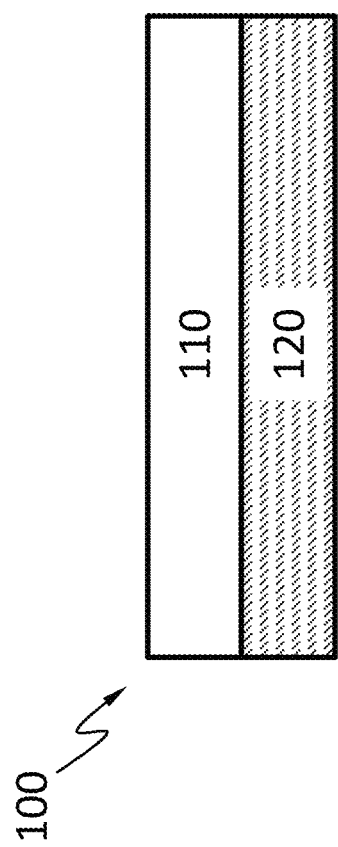
FIG. 2A schematically shows a cross-sectional view of a portion of the radiation detector, according to an embodiment.

FIG. 1 schematically shows an exemplary top view of a portion of a radiation detector 100, according to an embodiment. The radiation detector 100 comprises one or more pixels 150 disposed in a substrate (e.g., the radiation absorption layer 110 in FIG. 2A and FIG. 2B). The pixels 150 may be arranged in an array, such as a rectangular array, a honeycomb array, a hexagonal array or any other suitable array. The pixels 150 are configured to detect radiation particles incident thereon. The pixels 150 may be able to measure the energy of the radiation particle. In an example, each of the pixels 150 is configured to count numbers of radiation particles incident thereon whose energy falls in a plurality of bins, within a period of time; and all the pixels 150 may be configured to count the numbers of radiation particles incident thereon within a plurality of bins of energy within the same period of time. Each of the pixels 150 may have its own analog-to-digital converter (ADC) configured to digitize an analog signal representing the energy of an incident radiation particle into a digital signal. For some radiation detection applications, an ADC with a 10-bit resolution or higher is useful. Each of the pixels 150 may be configured to measure its dark current, such as before or concurrently with detection of each radiation particle incident thereon. Each of the pixels 150 may be configured to deduct the contribution of the dark current from the energy of the radiation particle incident thereon. The pixels 150 may be configured to operate in parallel. For example, when one of the pixels 150 measures an incident radiation particle, another one of the pixels 150 may be waiting for a radiation particle to arrive. The pixels 150 may not have to be individually addressable.

FIG. 1 also schematically shows that the pixels 150 are surrounded by a plurality of guard rings (e.g., first guard ring 151, second guard ring 152 and third guard ring 153), according to an embodiment. The guard rings may reduce dark current or may delay avalanche breakdown in the radiation detector 100. The guard rings may be continuous rings or have discrete portions arranged along a ring. The guard rings may be in any suitable shape and is certainly not limited to a circular or rectangular shape. The guard rings may be nested and surround the pixels 150. For example, the first guard ring 151 surrounds the pixels 150; the second guarding ring 152 surrounds the first guard ring 151; and the third guard ring 153, if exists, surrounds the second guard ring 152. In the example of FIG. 1, the radiation detector 100 may have two, three, or more guard rings surrounding the pixels 150.

FIG. 2A schematically shows a cross-sectional view of the radiation detector 100, according to an embodiment. The radiation detector 100 may include a radiation absorption layer 110 and an electronics layer 120 (e.g., an ASIC) for processing or analyzing electrical signals incident radiation generates in the radiation absorption layer 110. The radiation absorption layer 110 may include a semiconductor material such as, silicon, germanium, GaAs, CdTe, CdZnTe, or a combination thereof. The semiconductor may have a high mass attenuation coefficient for the radiation energy of interest.

Figure 2B:
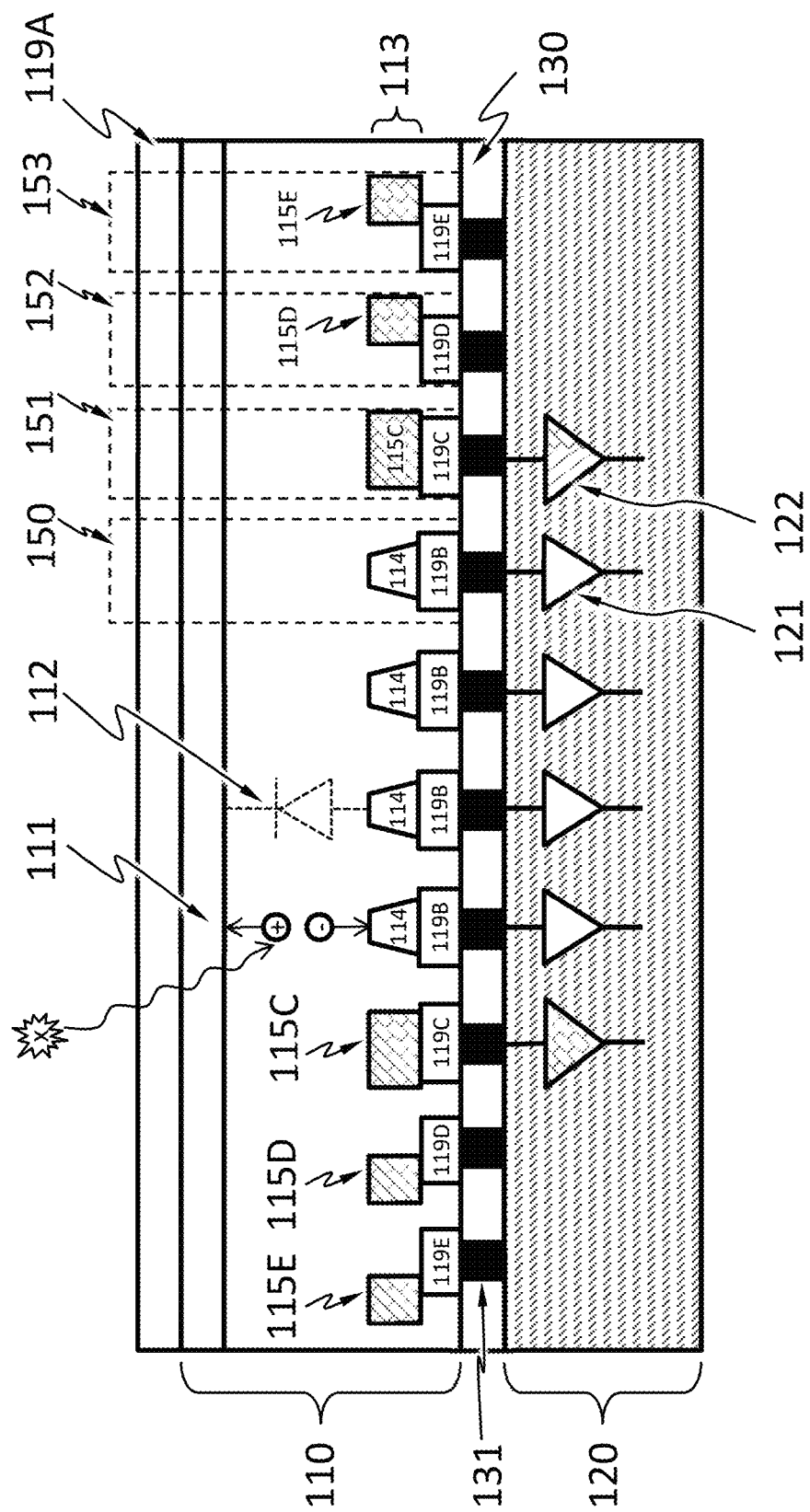
FIG. 2B schematically shows a detailed cross-sectional view of a portion of the radiation detector, according to an embodiment.

As shown in a detailed cross-sectional view of the radiation detector 100 in FIG. 2B, according to an embodiment, the radiation absorption layer 110 may include one or more diodes (e.g., p-i-n) formed by a first doped region 111, one or more discrete regions 114 of a second doped region 113. The second doped region 113 may be separated from the first doped region 111 by an optional the intrinsic region 112. The discrete regions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example of FIG. 2B, each of the discrete regions 114 of the second doped region 113 forms a diode with the first doped region 111 and the optional intrinsic region 112. Namely, in the example of FIG. 2B, the radiation absorption layer 110 has a plurality of diodes having the first doped region 111 and an electric contact 119A as a shared electrode. The first doped region 111 and the electric contact 119A may also have discrete portions. In an embodiment, the guard rings are in the radiation absorption layer 110 and may be positioned near a periphery of the radiation detector 100. The first guard ring 151 may be the nearest one to the pixels 150 among all the guard rings. The first guard ring 151 may have a doped semiconductor region 115C in the radiation absorption layer 110. The doped semiconductor region 115C may be part of the second doped region 113. The first guard ring 151 may have an electrically conductive layer 119C in electrical contact to the doped semiconductor region 115C. The second guard ring 152 may have a doped semiconductor region 115D in the radiation absorption layer 110. The doped semiconductor region 115D may be part of the second doped region 113. The second guard ring 152 may have an electrically conductive layer 119D in electrical contact to the doped semiconductor region 115D. The radiation absorption layer 110 may have additional guard rings surrounding the second guard ring 152. For example, the radiation absorption layer 110 may have the third guard ring 153. The third guard ring 153, if exists, may have a doped semiconductor region 115E in the radiation absorption layer 110. The doped semiconductor region 115E may be part of the second doped region 113. The third guard ring 153 may have an electrically conductive layer 119E in electrical contact to the doped semiconductor region 115E. The electric contacts, e.g., 119A, 119B, and the electrically conductive layers, e.g., 119C, 119D, 119E, may include electrically conductive materials such as Al, AlSi, Al/Ti/Ni/Ag, Ti/Ni/Ag, Ti/Au, or a combination thereof.

When a radiation particle hits the radiation absorption layer 110, the radiation particle may be absorbed and generate one or more charge carriers by a number of mechanisms. A radiation particle may generate 10 to 100000 charge carriers. The charge carriers may drift to the electrodes of one of the diodes under an electric field. The field may be an external electric field. The electric contact 119B may include discrete portions each of which is in electrical contact to the discrete regions 114.

The electronics layer 120 may include an electronic system 121, suitable for processing or interpreting signals generated by radiation particles incident on the radiation absorption layer 110. The electronic system 121 may include an analog circuitry such as a filter network, amplifiers, integrators, and comparators, or a digital circuitry such as a microprocessor, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the radiation absorption layer 110. Other techniques are possible to connect the electronic system 121 to the pixels without using vias.

The electronics layer 120 may include an electronic system 122 connected to the guard rings, suitable for processing or interpreting signals caused by dark current, according to an embodiment. The electronic system 122 may be electrically connected to the guard rings by vias 131. Other techniques are possible to connect the electronic system 122 to the guard rings without using vias.

Figure 3A:
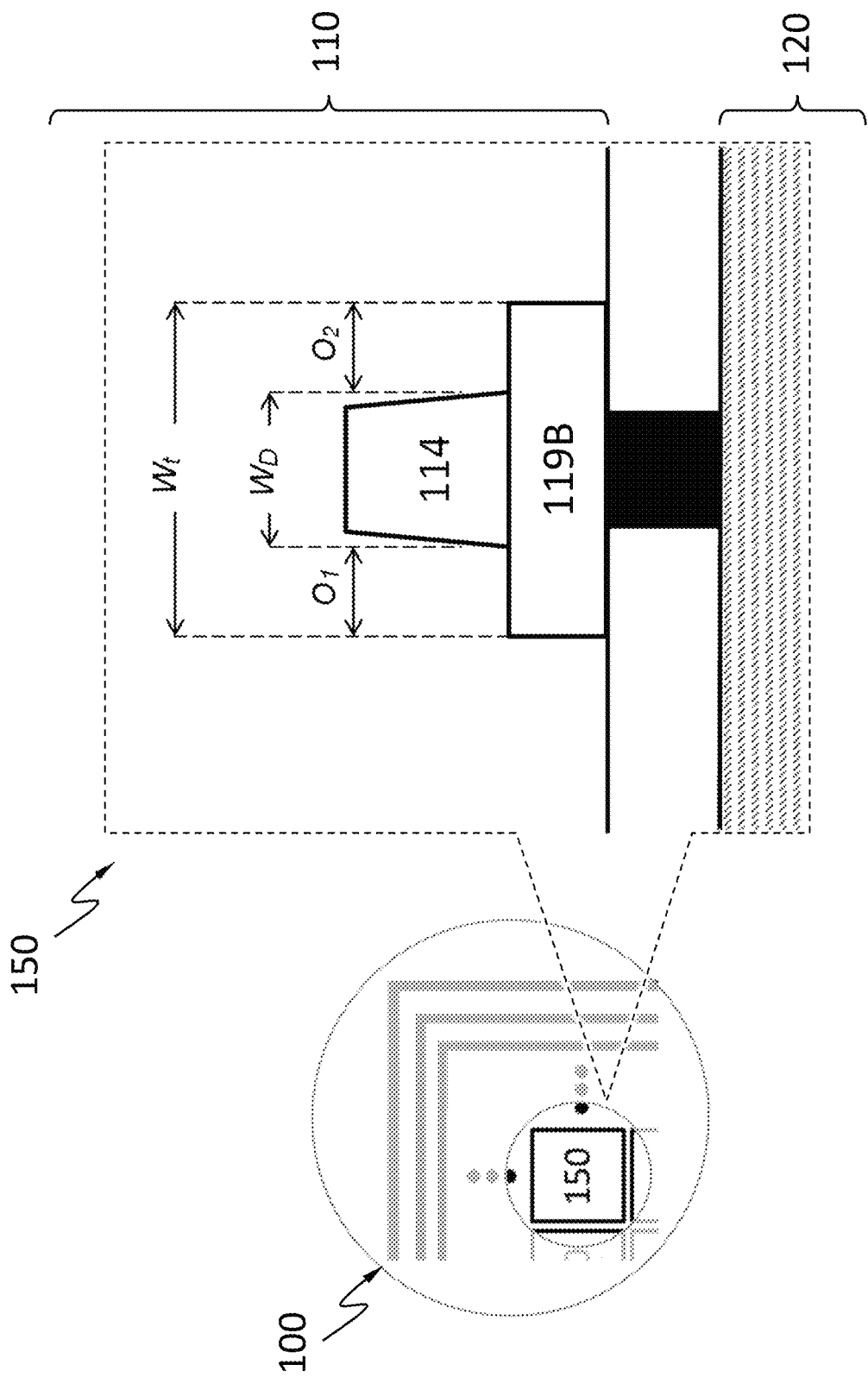
FIG. 3A schematically shows a detailed cross-sectional view of one pixel of the radiation detector, according to an embodiment.

FIG. 3A schematically shows a detailed cross-sectional view of one pixel 150 in the radiation absorption layer 110, according to an embodiment. The pixel 150 comprises a doped semiconductor region (e.g., the discrete region 114), and the electric contact 119B in electrical contact to the doped semiconductor region. As shown in FIG. 3A, a width $W_t$ of the electric contact 119B in a direction parallel to the radiation absorption layer 110 is greater than a width $W_D$ of the doped semiconductor region (e.g., the discrete region 114) in the same direction. The electric contact 119B overhangs the doped semiconductor region (e.g., the discrete region 114), by $O_1$ and $O_2$, in at least two opposite directions parallel to the radiation absorption layer 110. $O_1$ and $O_2$ may be the same or different.

Figure 3B:
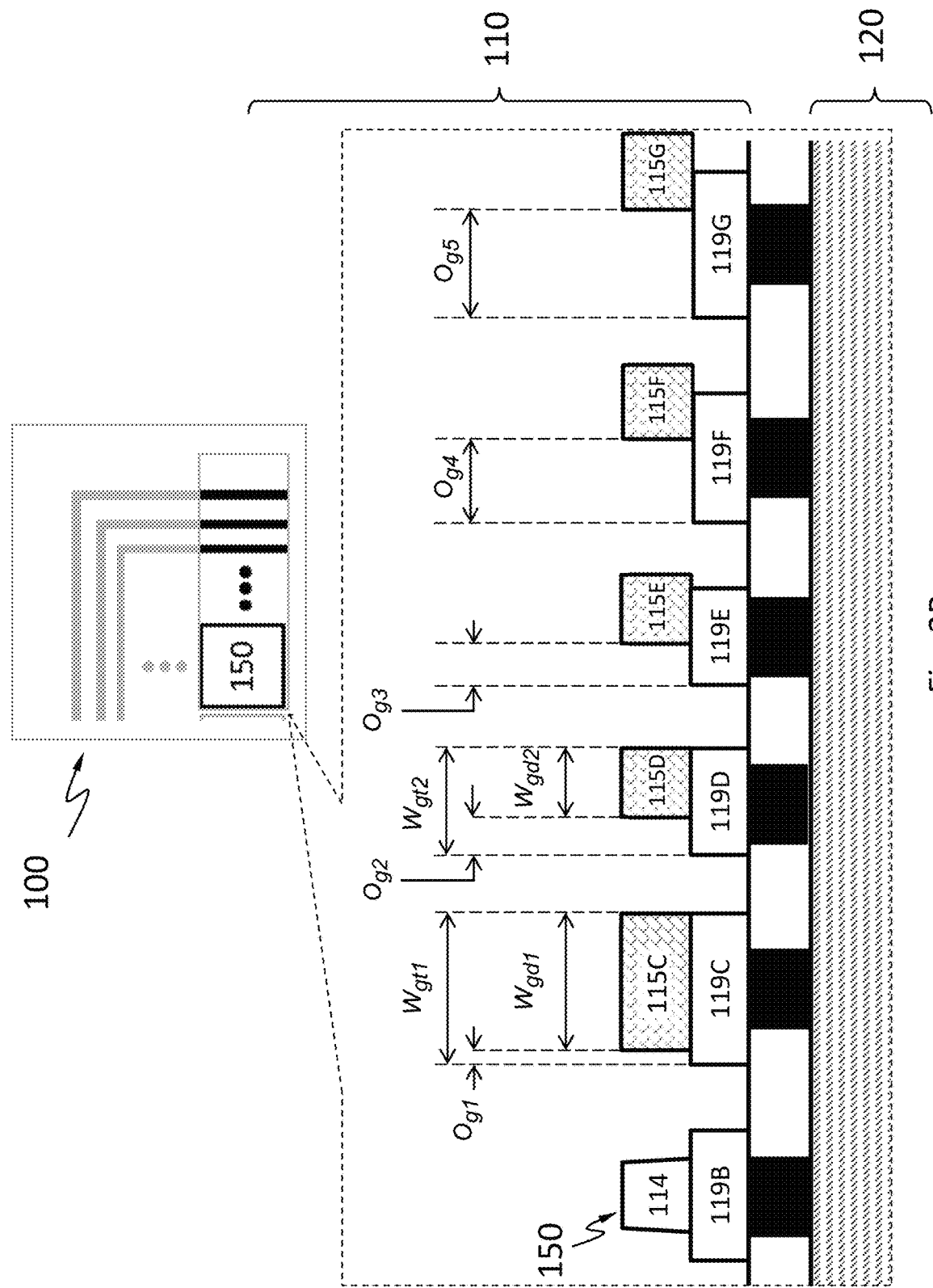
FIG. 3B schematically shows a detailed cross-sectional view of one pixel and several guard rings of the radiation detector, according to an embodiment.

FIG. 3B schematically shows a detailed cross-sectional view of a portion of the radiation absorption layer 110 comprising one of the pixels 150 and several guard rings, according to an embodiment. The first guard ring 151 is closest to the pixels 150 among all the guard rings. The pixels 150 are in the interior of the first guard ring 151. The interior of the first guard ring 151 is the area surrounded by the first guard ring 151. The other guard rings are in the exterior of the first guard ring 151. The exterior of the first guard ring 151 is the area not surrounded by the first guard ring 151. The other guard rings may include the second guard ring 152 comprising the electrically conductive layer 119D and doped semiconductor regions 115D, and optionally a third guard ring 153 ring comprising electrically conductive layer 119E and doped semiconductor regions 115E, a fourth guard ring comprising electrically conductive layer 119F and doped semiconductor regions 115F, a fifth guard ring comprising electrically conductive layer 119G and doped semiconductor regions 115G, etc. A width $W_{gt1}$ of the electrically conductive layer 119C along a line parallel to the radiation absorption layer 110 and extending from the interior of the first guard ring 151 to the exterior of the first guard ring 151 may be greater than a width $W_{gd1}$ of the doped semiconductor region 115C along the line. The electrically conductive layer 119C overhangs the doped semiconductor region 115C by an extent of $O_{g1}$ toward the interior of the first guard ring 151.

A width $W_{gt2}$ of the electrically conductive layer 119D along a line parallel to the radiation absorption layer 110 and extending from the interior of the second guard ring 152 to the exterior of the second guard ring 152 may be greater than a width $W_{gd2}$ of the doped semiconductor region 115D along the line. The electrically conductive layer 119D overhangs the doped semiconductor region 115D by an extent of $O_{g2}$ toward the interior of the second guard ring 152. The magnitude of $O_{g2}$ is greater than the magnitude of $O_{g1}$, according to an embodiment.

In the example of FIG. 3B, the third guard ring 153 surrounds the second guard ring 152; the fourth guard ring surrounds the third guard ring 153; the fifth guard ring surrounds the fourth guard ring. The electrically conductive layer of each guard ring overhangs the doped semiconductor region of that guard ring toward the interior of that the guard rings by a greater extent than another guard ring immediately in the interior. Namely, $O_{g2}$ is less than the extent of the overhang $O_{g3}$ of the third guard ring 153; $O_{g3}$ is less than the extent of the overhang $O_{g4}$ of the fourth guard ring; $O_{g4}$ is less than the extent of the overhang $O_{g5}$ of the fifth guard ring. In an example, the extent of the overhang is proportional to the dimension of the guard ring parallel to the radiation absorption layer 110.

Figure 4:
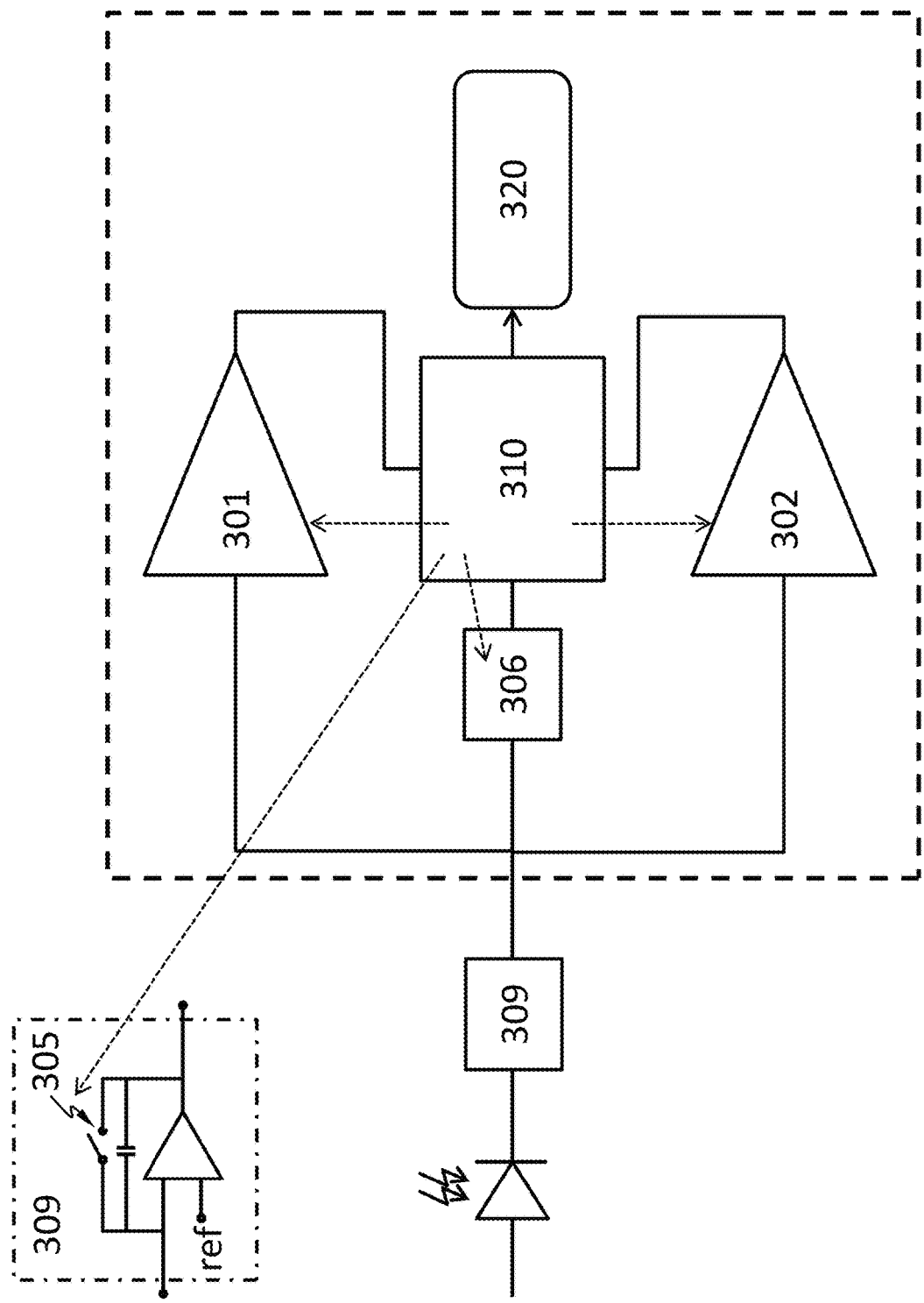
FIG. 4 schematically shows a component diagram of the electronic system of the radiation detector, according to an embodiment.

FIG. 4 schematically shows a component diagram of the electronic system 121 of the radiation detector 100, according to an embodiment. The electronic system 121 may include a first voltage comparator 301, a second voltage comparator 302, a counter 320, a switch 305, an ADC 306 and a controller 310.

The first voltage comparator 301 is configured to compare the voltage of the electric contact 119B to a first threshold. The first voltage comparator 301 may be configured to monitor the voltage directly, or calculate the voltage by integrating an electric current flowing through the diode over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident radiation particle. The first voltage comparator 301 configured as a continuous comparator is especially suitable when the incident radiation intensity is relatively high. The first voltage comparator 301 may be a clocked comparator, which has the benefit of lower power consumption. The first voltage comparator 301 configured as a clocked comparator may cause the system 121 to miss signals generated by some incident radiation particles. When the incident radiation intensity is low, the chance of missing an incident radiation particle is low because the time interval between two successive particles is relatively long. Therefore, the first voltage comparator 301 configured as a clocked comparator is especially suitable when the incident radiation intensity is relatively low. The first threshold may be 1-5%, 5-10%, 10%-20%, 20-30%, 30-40% or 40-50% of the maximum voltage one incident radiation particle may generate on the electric contact 119B. The maximum voltage may depend on the energy of the incident radiation particle (i.e., the wavelength of the incident radiation), the material of the radiation absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the diode over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{if } x \geq 0 \\ -x, \text{if } x \leq 0 \end{cases}.$$

The second threshold may be 200%-300% of the first threshold. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident radiation. However, having a high speed is often at the cost of power consumption.

The counter 320 may be a software component (e.g., numbers stored in a computer memory) or a hardware component (e.g., 4017 IC and 7490 IC). The counter 320 is configured to register a number of radiation particles reaching the diode. When the energy of an incident radiation particle is determined by the ADC 306 to be in the bin the counter 320 is associated with, the number registered in the counter 320 is increased by one.

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire after the voltage becomes stable, i.e., the rate of change of the voltage is substantially zero. The phase "the rate of change is substantially zero" means that temporal change is less than 0.1%/ns. The phase "the rate of change is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold, and the energy of the radiation particle falls in the bin associated with the counter 320.

The controller 310 may be configured to cause the ADC 306 to digitize the voltage upon expiration of the time delay and determine based on the voltage which bin the energy of the radiation particle falls in.

The controller 310 may be configured to connect the electric contact 119B to an electrical ground, so as to reset the voltage and discharge any charge carriers accumulated on the electric contact 119B. In an embodiment, the electric contact 119B is connected to an electrical ground after the expiration of the time delay. In an embodiment, the electric contact 119B is connected to an electrical ground for a finite reset time period. The controller 310 may connect the electric contact 119B to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The ADC 306 may feed the voltage it measures to the controller 310 as an analog or digital signal. The ADC may be a successive-approximation-register (SAR) ADC (also called successive approximation ADC). An SAR ADC digitizes an analog signal via a binary search through all possible quantization levels before finally converging upon a digital output for the analog signal. An SAR ADC may have four main subcircuits: a sample and hold circuit to acquire the input voltage ($V_{in}$), an internal digital-analog converter (DAC) configured to supply an analog voltage comparator with an analog voltage equal to the digital code output of the successive approximation register (SAR), the analog voltage comparator that compares $V_{in}$ to the output of the internal DAC and outputs the result of the comparison to the SAR, the SAR configured to supply an approximate digital code of $V_{in}$ to the internal DAC. The SAR may be initialized so that the most significant bit (MSB) is equal to a digital 1. This code is fed into the internal DAC, which then supplies the analog equivalent of this digital code ($V_{ref}/2$) into the comparator for comparison with $V_{in}$. If this analog voltage exceeds $V_{in}$ the comparator causes the SAR to reset this bit; otherwise, the bit is left a 1. Then the next bit of the SAR is set to 1 and the same test is done, continuing this binary search until every bit in the SAR has been tested. The resulting code is the digital approximation of $V_{in}$ and is finally output by the SAR at the end of the digitization.

Figure 5:
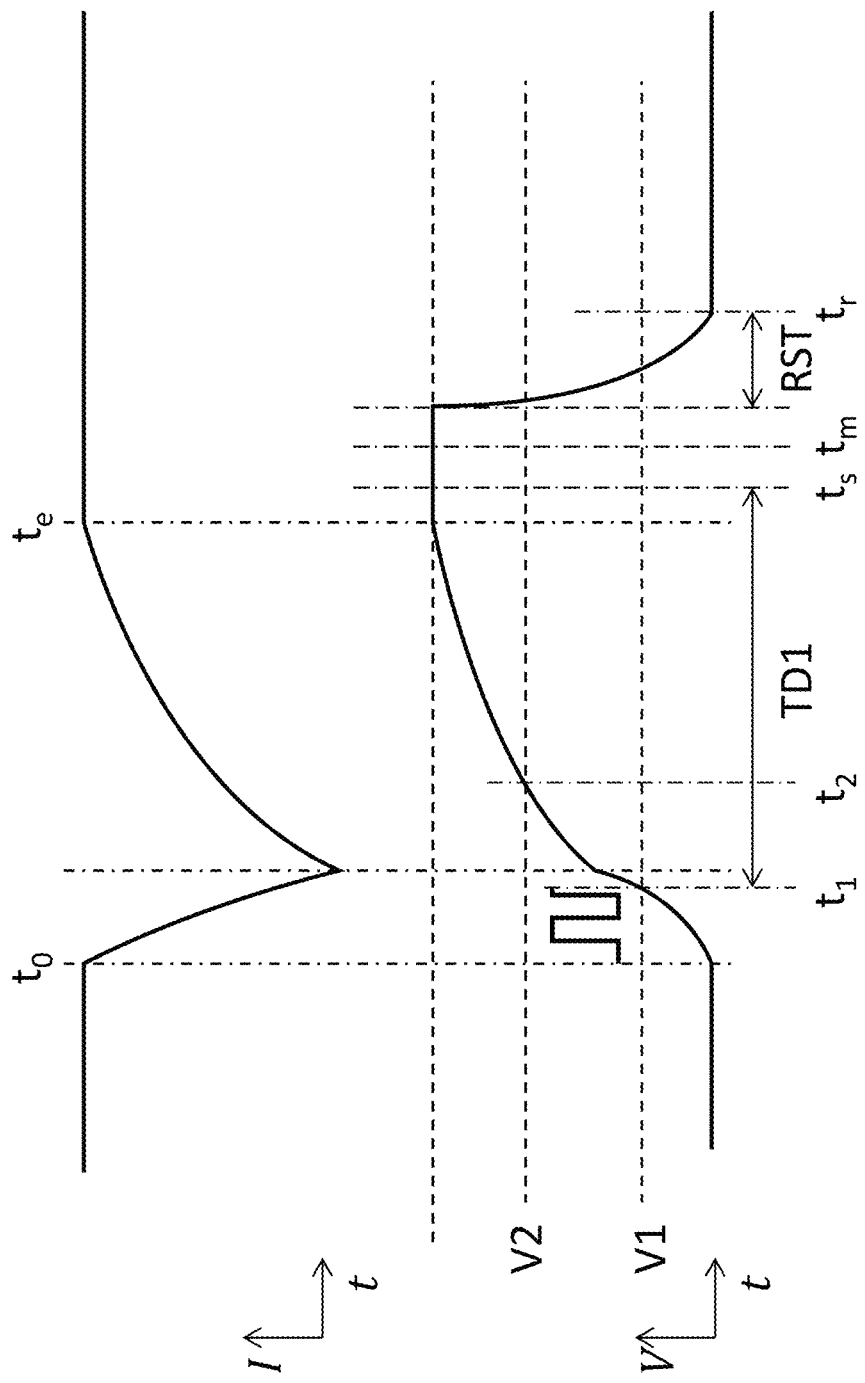
FIG. 5 schematically shows a temporal change of the electric current flowing through an electric contact (upper curve) of a diode of a radiation absorption layer exposed to radiation, the electric current caused by charge carriers generated by a radiation particle incident on the radiation absorption layer, and a corresponding temporal change of the voltage of the electric contact (lower curve), according to an embodiment.

The system 121 may include a capacitor module 309 electrically connected to the electric contact 119B, wherein the capacitor module is configured to collect charge carriers from the electric contact 119B. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electric contact accumulate on the capacitor over a period of time ("integration period") (e.g., as shown in FIG. 5, between is to to). After the integration period has expired, the capacitor voltage is sampled by the ADC 306 and then reset by a reset switch. The capacitor module 309 can include a capacitor directly connected to the electric contact 119B.

FIG. 5 schematically shows a temporal change of the electric current flowing through the electric contact 119B (upper curve) caused by charge carriers generated by a radiation particle incident on the pixel 150 associated with the electric contact 119B, and a corresponding temporal change of the voltage of the electric contact 119B (lower curve), according to an embodiment. The voltage may be an integral of the electric current with respect to time. At time to, the radiation particle hits the diode or the resistor, charge carriers start being generated in the pixel 150, electric current starts to flow through the electric contact 119B, and the absolute value of the voltage of the electric contact 119B starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 waits for stabilization of the voltage to stabilize. The voltage stabilizes at time $t_e$, when all charge carriers generated by the radiation particle drift out of the radiation absorption layer 110. At time $t_s$, the time delay TD1 expires. At or after time $t_e$, the controller 310 causes the ADC 306 to digitize the voltage and determines which bin the energy of the radiation particles falls in. The controller 310 then causes the number registered by the counter 320 corresponding to the bin to increase by one. In the example of FIG. 5, time $t_s$ is after time $t_e$; namely TD1 expires after all charge carriers generated by the radiation particle drift out of the radiation absorption layer 110. If time $t_e$ cannot be easily measured, TD1 can be empirically chosen to allow sufficient time to collect essentially all charge carriers generated by a radiation particle but not too long to risk have another incident radiation particle. Namely, TD1 can be empirically chosen so that time $t_s$ is empirically after time $t_e$. Time $t_s$ is not necessarily after time $t_e$ because the controller 310 may disregard TD1 once V2 is reached and wait for time $t_e$. The rate of change of the difference between the voltage and the contribution to the voltage by the dark current is thus substantially zero at $t_e$. The controller 310 may be configured to deactivate the second voltage comparator 302 at expiration of TD1 or at $t_2$, or any time in between.

The voltage at time $t_e$ is proportional to the amount of charge carriers generated by the radiation particle, which relates to the energy of the radiation particle. The controller 310 may be configured to determine the bin the energy of the radiation particle falls in, based on the output of the ADC 306.

Figure 6:
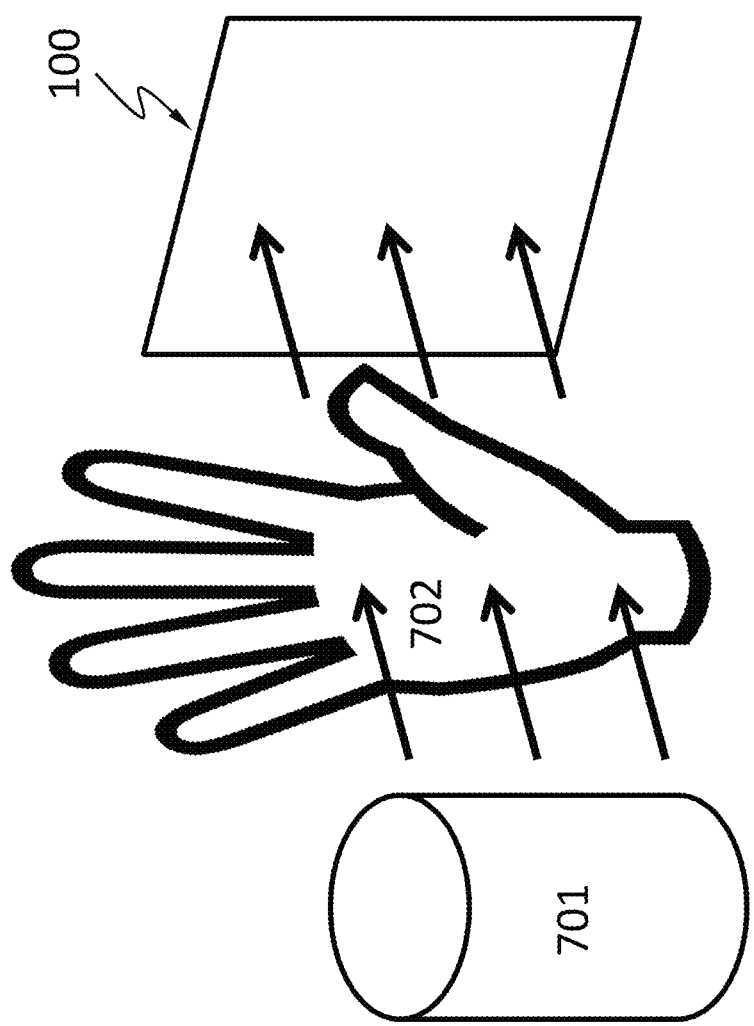
FIG. 6-FIG. 12 each schematically show a system comprising the radiation detector described herein.

After TD1 expires or digitization by the ADC 306, whichever later, the controller 310 connects the electric contact 119B to an electric ground for a reset period RST to allow charge carriers accumulated on the electric contact 119B to flow to the ground and reset the voltage. After RST, the system 121 is ready to detect another incident radiation particle. Implicitly, the rate of incident radiation particles the system 121 can handle in the example of FIG. 6 is limited by 1/(TD1+RST). If the first voltage comparator 301 has been deactivated, the controller 310 can activate it at any time before RST expires. If the controller 310 has been deactivated, it may be activated before RST expires.

Because the detector 100 has many pixels 150 that may operate in parallel, the detector can handle much higher rate of incident radiation particles. This is because the rate of incidence on a particular pixel 150 is 1/N of the rate of incidence on the entire array of pixels, where N is the number of pixels.

FIG. 6 schematically shows a system comprising the radiation detector 100 described herein. The system may be used for medical imaging such as chest radiation radiography, abdominal radiation radiography, dental radiation radiography, etc. The system comprises a radiation source 701. radiation emitted from the radiation source 701 penetrates an object 702 (e.g., a human body part such as chest, limb, abdomen, mouth), is attenuated by different degrees by the internal structures of the object 702 (e.g., bones, muscle, fat, organs and teeth, etc.), and is projected to the radiation detector 100. The radiation detector 100 forms an image by detecting the intensity distribution of the radiation.

Figure 7:
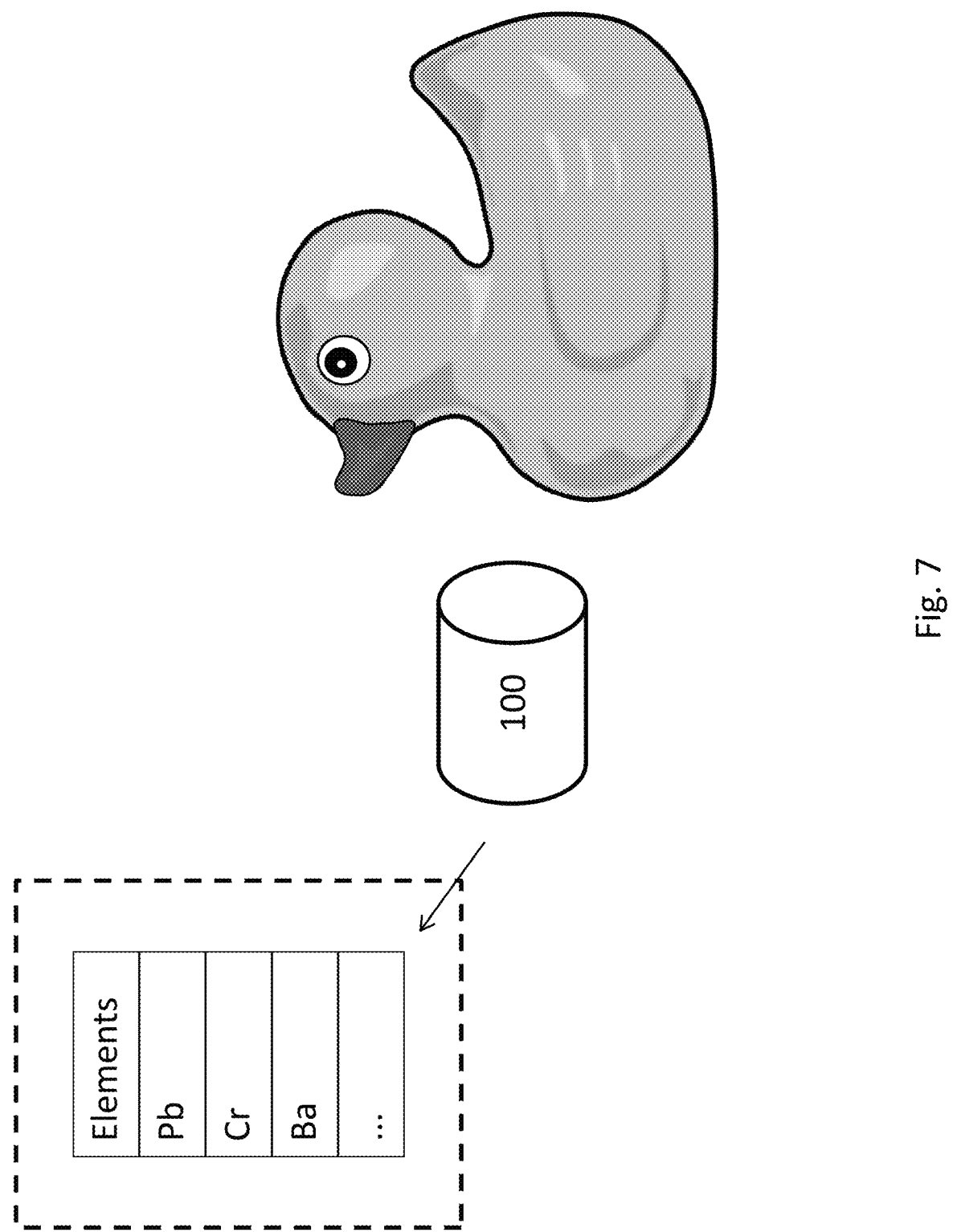

FIG. 7 schematically shows an element analyzer comprising the radiation detector 100 described herein. The element analyzer measurer is capable of detecting presence of one or more elements of interest on an object such as a toy. A high-energy beam of charged particles such as electrons or protons, or a beam of radiations, is directed onto the object. Atoms of the objects are excited and emit radiation at specific wavelengths that are characteristic of the elements. The radiation detector 100 receives the emitted radiation and determines the presence of the elements based on the energy of the emitted radiation. For example, the radiation detector 100 may be configured to detect radiation at wavelengths Pb would emit. If the radiation detector 100 actually receives radiation from the object at these wavelengths, it can tell that Pb is present. The radiation detector 100 described here may have other applications such as in a radiation telescope, radiation mammography, industrial radiation defect detection, radiation microscopy or microradiography, radiation casting inspection, radiation non-destructive testing, radiation weld inspection, radiation digital subtraction angiography, etc. It may be suitable to use this radiation detector 100 in place of a photographic plate, a photographic film, a PSP plate, a radiation image intensifier, a scintillator, or another radiation detector.

Figure 8:
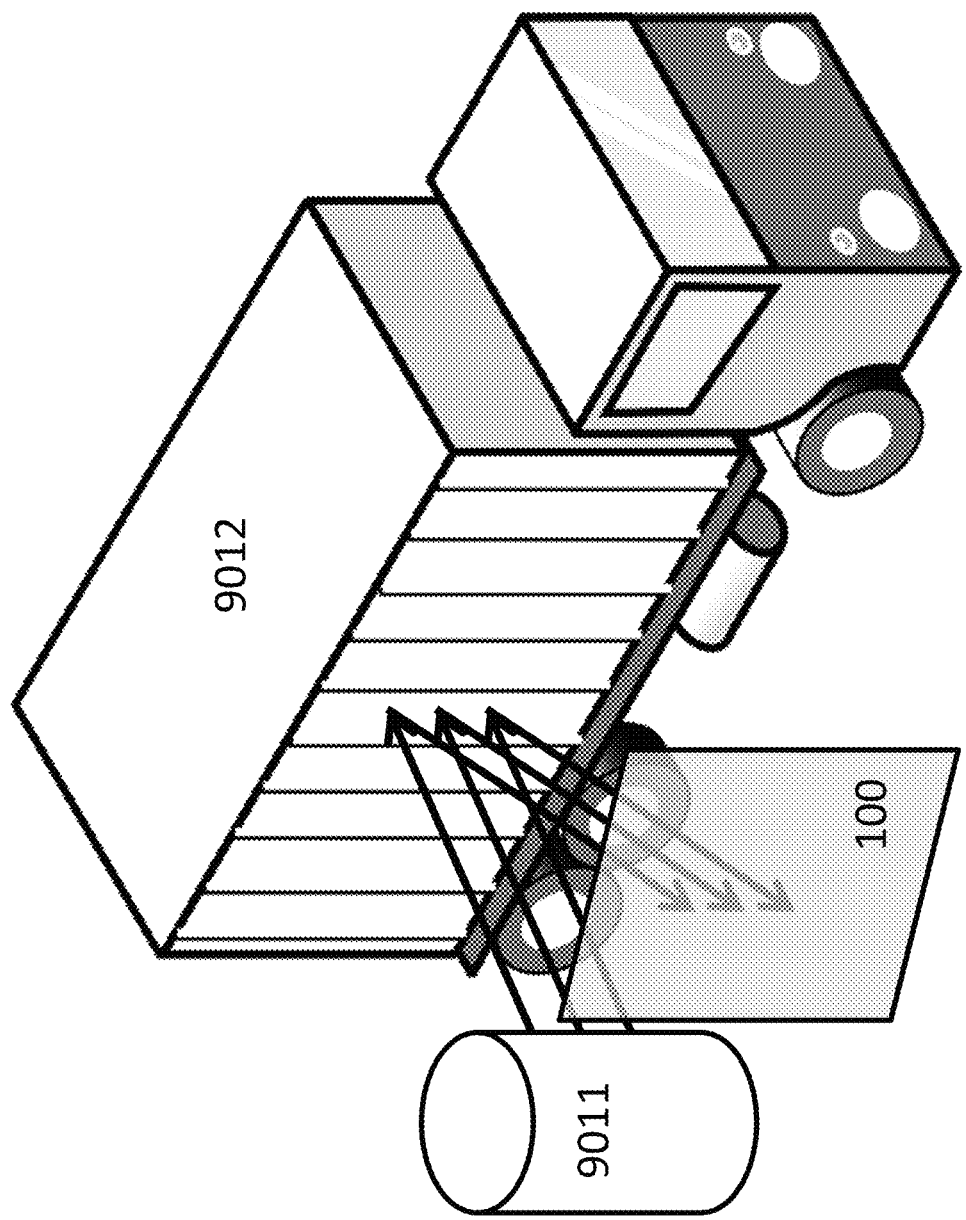

FIG. 8 schematically shows a cargo scanning or non-intrusive inspection (NII) system comprising the radiation detector 100 described herein. The system may be used for inspecting and identifying goods in transportation systems such as shipping containers, vehicles, ships, luggage, etc. The system comprises a radiation source 9011. radiation emitted from the radiation source 9011 may backscatter from an object 9012 (e.g., shipping containers, vehicles, ships, etc.) and be projected to the radiation detector 100. Different internal structures of the object 9012 may backscatter radiation differently. The radiation detector 100 forms an image by detecting the intensity distribution of the backscattered radiation and/or energies of the backscattered radiation particles.

Figure 9:
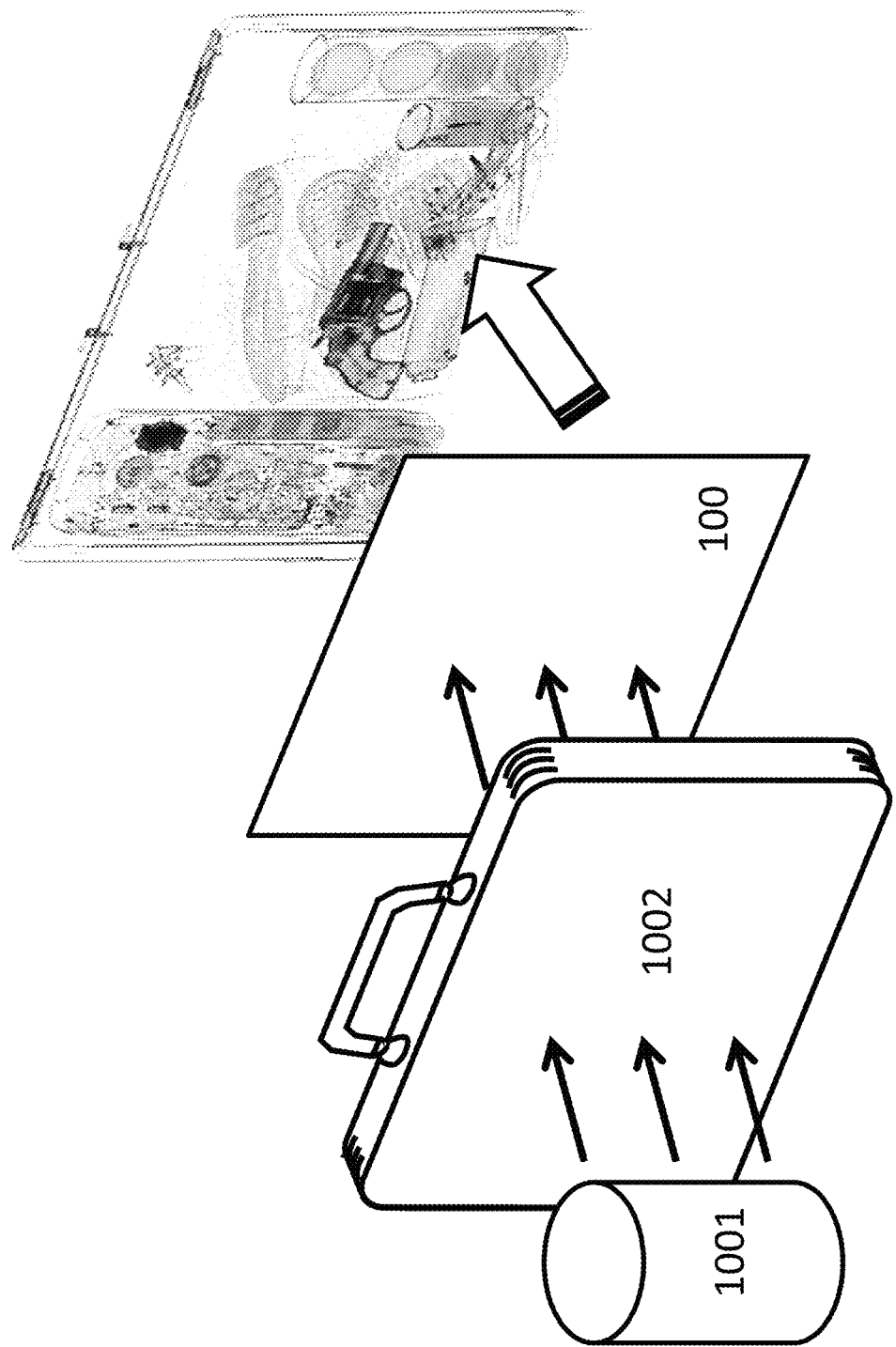

FIG. 9 schematically shows another cargo scanning or non-intrusive inspection (NII) system comprising the radiation detector 100 described herein. The system may be used for luggage screening at public transportation stations and airports. The system comprises a radiation source 1001. radiation emitted from the radiation source 1001 may penetrate a piece of luggage 1002, be differently attenuated by the contents of the luggage, and projected to the radiation detector 100. The radiation detector 100 forms an image by detecting the intensity distribution of the transmitted radiation. The system may reveal contents of luggage and identify items forbidden on public transportation, such as firearms, narcotics, edged weapons, flammables.

Figure 10:
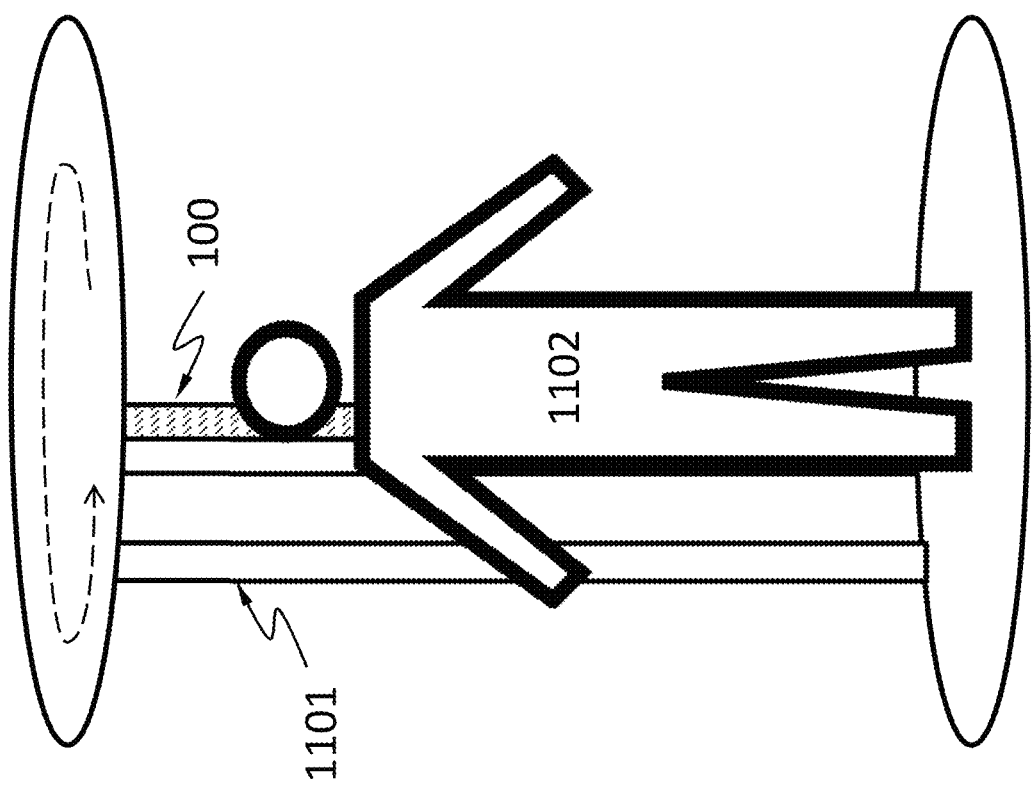

FIG. 10 schematically shows a full-body scanner system comprising the radiation detector 100 described herein. The full-body scanner system may detect objects on a person's body for security screening purposes, without physically removing clothes or making physical contact. The full-body scanner system may be able to detect non-metal objects. The full-body scanner system comprises a radiation source 1101. radiation emitted from the radiation source 1101 may backscatter from a human 1102 being screened and objects thereon, and be projected to the radiation detector 100. The objects and the human body may backscatter radiation differently. The radiation detector 100 forms an image by detecting the intensity distribution of the backscattered radiation. The radiation detector 100 and the radiation source 1101 may be configured to scan the human in a linear or rotational direction.

Figure 11:
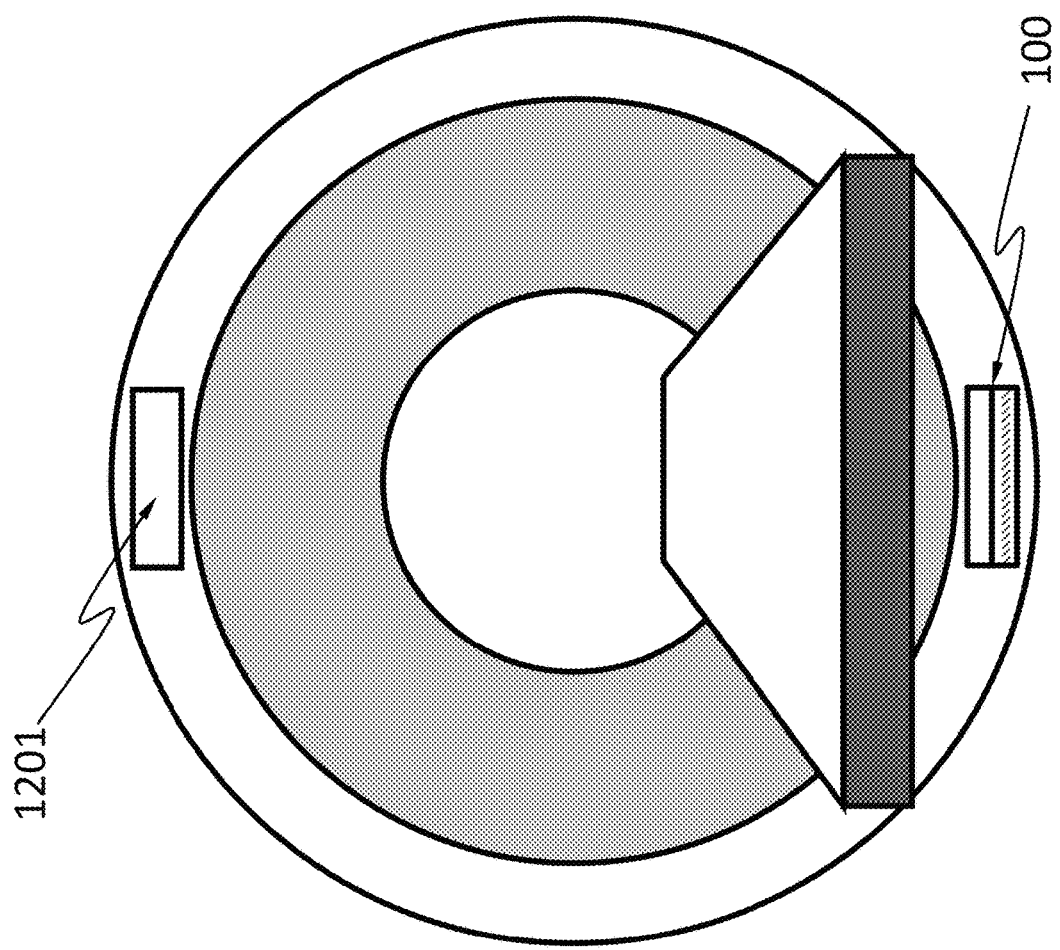

FIG. 11 schematically shows a radiation computed tomography (radiation CT) system comprising the radiation detector 100 described herein. The radiation CT system uses computer-processed radiations to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The radiation CT system comprises the radiation detector 100 described herein and an radiation source 1201. The radiation detector 100 and the radiation source 1201 may be configured to rotate synchronously along one or more circular or spiral paths.

Figure 12:
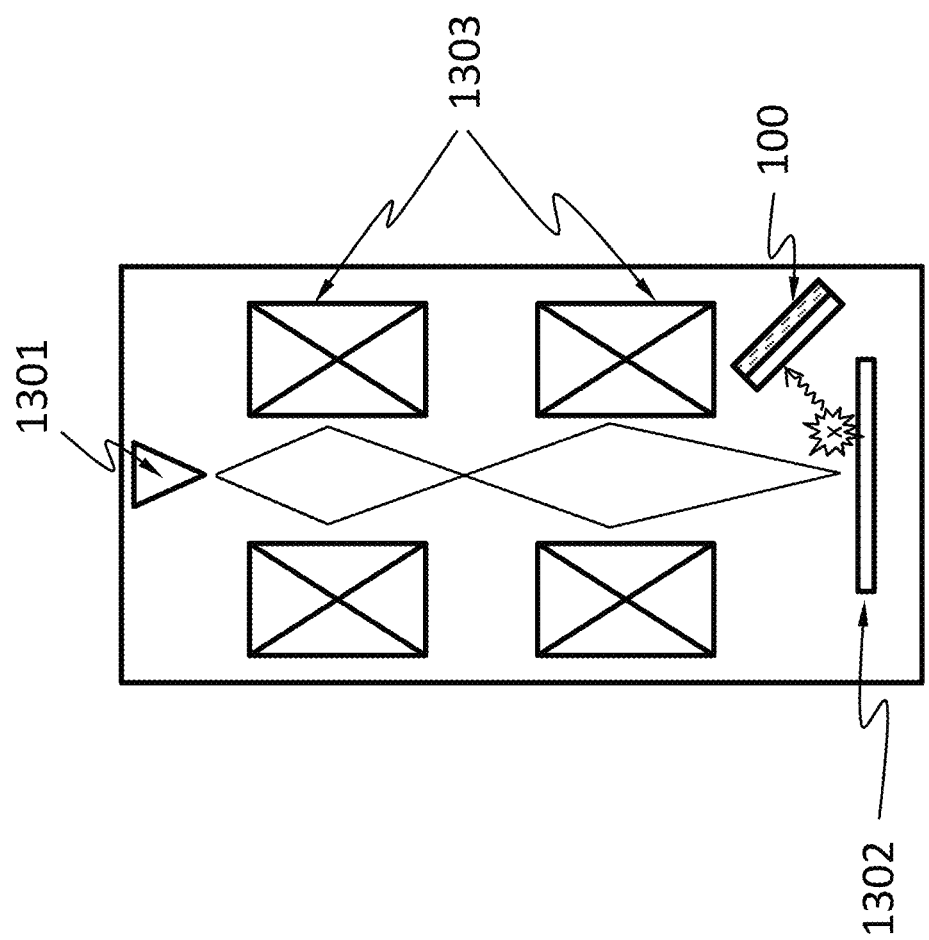

FIG. 12 schematically shows an electron microscope comprising the radiation detector 100 described herein. The electron microscope comprises an electron source 1301 (also called an electron gun) that is configured to emit electrons. The electron source 1301 may have various emission mechanisms such as thermionic, photocathode, cold emission, or plasmas source. The emitted electrons pass through an electronic optical system 1303, which may be configured to shape, accelerate, or focus the electrons. The electrons then reach a sample 1302 and an image detector may form an image therefrom. The electron microscope may comprise the radiation detector 100 described herein, for performing energy-dispersive radiation spectroscopy (EDS). EDS is an analytical technique used for the elemental analysis or chemical characterization of a sample. When the electrons incident on a sample, they cause emission of characteristic radiations from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of a radiation. The number and energy of the radiations emitted from the sample can be measured by the radiation detector 100.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A detector, comprising:
   a pixel configured to detect radiation particles incident thereon, the pixel disposed in a substrate;
   a first guard ring in the substrate and surrounding the pixel, the first guard ring comprising a first doped semiconductor region in the substrate and a first electrically conductive layer in electrical contact to the first doped semiconductor region;
   a second guard ring in the substrate and surrounding the first guard ring, the second guard ring comprising a second doped semiconductor region in the substrate and a second electrically conductive layer in electrical contact to the second doped semiconductor region;

wherein the first electrically conductive layer overhangs the first doped semiconductor region by a first extent toward an interior of the first guard ring;
wherein the second electrically conductive layer overhangs the second doped semiconductor region by a second extent toward an interior of the second guard ring;
wherein the second extent is greater than the first extent.

2. The detector of claim 1, wherein the detector comprises a plurality of pixels arranged in an array and the plurality of pixels are surrounded by the first guard ring.

3. The detector of claim 1, wherein the pixel comprises a doped semiconductor region in the substrate and an electric contact in electrical contact to the doped semiconductor region; wherein the electric contact overhangs the doped semiconductor region in at least two opposite directions parallel to the substrate.

4. The detector of claim 3, wherein the electric contact overhangs the doped semiconductor region in at least two opposite directions by a same extent.

5. The detector of claim 1, further comprising:
a third guard ring in the substrate and surrounding the second guard ring, the third guard ring comprising a third doped semiconductor region in the substrate and a third electrically conductive layer in electrical contact to the third doped semiconductor region;
wherein the third electrically conductive layer overhangs the third doped semiconductor region by a third extent toward an interior of the third guard ring;
wherein the third extent is greater than the second extent.

6. The detector of claim 1, wherein the pixel is configured to count the radiation particles incident thereon.

7. The detector of claim 1, wherein the first electrically conductive layer has a greater width along a line parallel to the substrate and extending from the interior of the first guard ring to an exterior of the first guard ring, than the first doped semiconductor region.

8. The detector of claim 1, further comprising an electronics system;
wherein the pixel comprises at least an electric contact;
wherein the electronics system comprises:
a first voltage comparator configured to compare a voltage of the electric contact to a first threshold;
a second voltage comparator configured to compare the voltage to a second threshold;
a counter configured to register a number of radiation particles reaching the pixel;
a controller;
wherein the controller is configured to start a time delay from a time at which the first voltage comparator determines that an absolute value of the voltage equals or exceeds an absolute value of the first threshold;
wherein the controller is configured to activate the second voltage comparator during the time delay;
wherein the controller is configured to cause the number registered by the counter to increase by one, when the second voltage comparator determines that an absolute value of the voltage equals or exceeds an absolute value of the second threshold.

9. The detector of claim 8, wherein the electronics system further comprises a capacitor module electrically connected to the electric contact, wherein the capacitor module is configured to collect charge carriers from the electric contact.

10. The detector of claim 8, wherein the controller is configured to activate the second voltage comparator at a beginning or expiration of the time delay.

11. The detector of claim 8, wherein the electronics system further comprises a voltmeter, wherein the controller is configured to cause the voltmeter to measure the voltage upon expiration of the time delay.

12. The detector of claim 8, wherein the controller is configured to determine a radiation particle energy based on a value of the voltage measured upon expiration of the time delay.

13. The detector of claim 8, wherein the controller is configured to connect the electric contact to an electrical ground.

14. The detector of claim 8, wherein a rate of change of the voltage is substantially zero at expiration of the time delay.

15. The detector of claim 8, wherein a rate of change of the voltage is substantially non-zero at expiration of the time delay.

* * * * *